Aug. 3, 1965

R. L. MARTIN, JR 3,199,002

SOLID-STATE CIRCUIT WITH CROSSING LEADS
AND METHOD FOR MAKING THE SAME

Filed April 17, 1961

INVENTOR.
ROBERT L. MARTIN, JR.

BY

Lippincott, Ralls & Hendricson
ATTORNEYS

United States Patent Office 3,199,002

Patented Aug. 3, 1965

3,199,002

SOLID-STATE CIRCUIT WITH CROSSING LEADS AND METHOD FOR MAKING THE SAME

Robert L. Martin, Jr., Palo Alto, Calif., assignor, by mesne assignments, to Fairchild Camera and Instrument Corporation, Syosset, N.Y., a corporation of Delaware Filed Apr. 17, 1961, Ser. No. 103,564
4 Claims. (Cl. 317—234)

This invention relates to solid-state electrical circuits comprising a plurality of functional circuit elements fabricated within a single body of semiconductor. The term "functional circuit elements" is used herein to mean circuit elements that perform any function other than mere interconnection; that is, all circuit elements that would be illustrated in a circuit diagram by some symbol other than a connecting line. The several functional circuit elements are advantageously interconnected by conductive strips that extend over a layer of insulation on a surface of the semiconductor, as disclosed, for example, in United States Patent No. 2,981,877, issued to Robert N. Noyce on April 25, 1961.

The principal object of this invention is to provide a solid-state electrical circuit of the type described, in which two or more electrical connections cross each other without being interconnected.

Briefly, according to the present invention, the body of semiconductor also contains a conductive region that is adjacent to the insulation-covered surface and is bounded by a pan-shaped p-n junction. Two of the conductive strips extend through the layer of insulation into contact with different portions of this conductive region, and are thereby electrically connected together, so that the two strips and conductive region in series form one electrical connection or circuit path. The layer of insulation extends across said conductive region between the two strips that are interconnected by it, and a third one of the conductive strips extends over this layer of insulation across the conductive region, thereby forming a second electrical connection or circuit path that crosses the first without connecting to it.

In a preferred method of manufacture, the insulating layer is a layer of oxidized semiconductor, e.g., an oxidized surface layer upon a monocrystalline body of silicon, which is the preferred semiconductor. The conductive region at the lead crossing is formed preferably by photoengraving a hole in the oxide layer and diffusing an appropriate donor or acceptor impurity through this hole into the semiconductor. During or following this diffusion step the exposed semiconductor layer is reoxidized, forming a new oxide layer, exposing the semiconductor surface over two portions of the conductive region. The connecting leads to these two exposed areas are then applied, and the crossing strip is placed over the oxide layer between the two exposed areas, preferably by depositing a metallic film over the whole surface and then removing unwanted metal by photoengraving.

The invention may be better understood from the following illustrative description and the accompanying drawings. To facilitate an understanding of the invention, a specific example is illustrated and described, consisting of four diodes interconnected in a four-terminal network, but it should be understood that the invention is not limited to this particular embodiment.

FIG. 1 of the drawings is a greatly enlarged, somewhat schematic plan view of a solid-state electrical circuit with two crossing leads.

Figure 1:
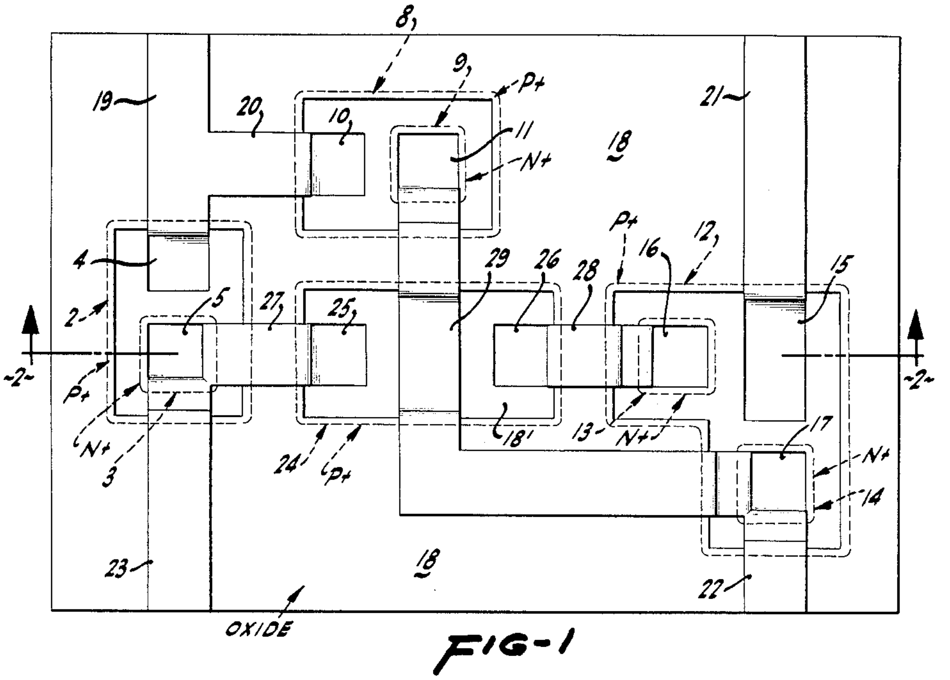
Figure 2:
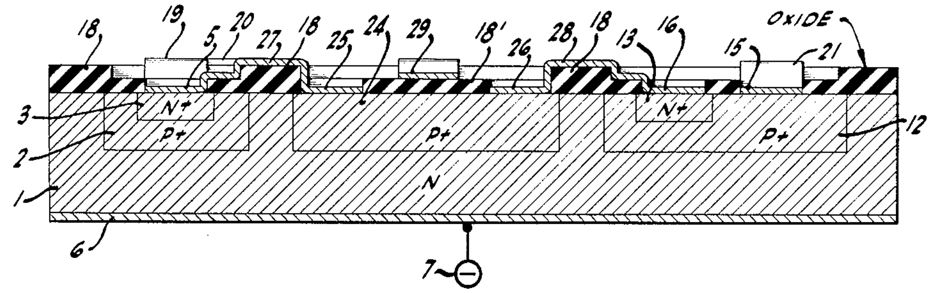
FIG. 2 is a section taken along the line 2—2 of FIG. 1.

Referring to FIGS. 1 and 2, a monocrystalline body 1 of semiconductor, e.g., silicon, contains a plurality of regions of different types of conductivities that define a plurality of separate functional circuit elements, in this case four crystal diodes. Usually, the body 1 is mostly of one type, n-type in the example illustrated, and contains a number of regions of the opposite type within which the several functional circuit elements are fabricated. In the example shown, a region 2 of p+-type (+ indicates relatively heavy doping and high conductivity) contains a smaller region 3 of n+-type. A pan-shaped, rectifying p-n junction lies between the regions 2 and 3, so that these two regions together form a crystal diode between the two electrodes 4 and 5, which may be metallic films deposited on the top surface of the body of semiconductor over and in contact with portions of regions 2 and 3, respectively.

By coating the lower surface of body 1 with an electrode 6, which may be connected to a source of relatively negative potential, as indicated symbolically in FIG. 2, the outer junction surrounding region 2 is kept reverse-biased to isolate region 2 electrically from the other circuit elements fabricated in the same body of semiconductor, and hereinafter described. Region 2 is made deep enought (so that the distance between the two p-n junctions is substantially greater than an electron or hole diffusion length) that the current across one junction does not significantly influence the current across the other, and there is no triode or transistor action.

It is evident that body 1 could be mostly p-type semiconductor, region 2 could be n-type or n+-type, and region 3 could be p+-type, without changing the principles or the operation described, except that in this case a relatively positive potential would be provided at 7, and the direction of easy current flow between the electrodes 4 and 5 would be reversed. Or, body 1 could be mostly intrinsic semiconductor, or of such high resistivity that it would, in effect, constitute an insulator between the several functional circuit elements, in which case the bias voltage would be unnecessary.

Another region 8 of p+-type contains a smaller region 9 of n+-type, forming a second crystal diode between electrodes 10 and 11. Still another region 12 of p+-type contains two smaller regions 13 and 14 of n+-type, forming one crystal diode between electrodes 15 and 16 and another crystal diode between electrodes 15 and 17. Thus, the structure illustrated and described comprises four crystal diodes, which are electrically separate from one another (apart from the interconnecting leads to be described), except that two of the diodes have one terminal 15 in common.

In the embodiment illustrated, all of the regions described extend to the top surface of the body of semiconductor, and are separated from one another by pan-shaped p-n junctions. Preferably, all of the top surface that is not occupied by electrodes in contact with the semiconductor is covered by a layer 18 of insulation, which preferably consists of an oxidized layer of the semiconductor, formed at an early stage in the fabrication of the solid-state circuit and remaining essentially intact thereafter, covering and protecting the edges of the p-n junctions.

The four crystal diodes hereinbefore described are connected together in a four-terminal network by means of conductive strips, preferably consisting of thin coatings or films of metal extending over and adhering to the layer 18 of insulation and thereby separated and insulated from the body of semiconductor. Strip 19 constitutes one input terminal of the four-terminal network, and extends to and connects with electrode 4 of the first crystal diode. Strip 20 branches off from strip 19 and connects it to electrode 10 of the second crystal diode. Strip 21 forms a second terminal of the four-terminal network, and extends to and connects with electrode 15 that is common to the third and fourth diodes. Strip 22 constitutes a third terminal of the four-terminal network, and extends to and connects with electrode 17 of the fourth diode. Strip 23 constitutes the fourth terminal of the four-terminal network, and extends to and connects with electrode 5 of the first diode.

To complete the network required, it is now necessary to connect electrode 5 to electrode 16 and to connect electrode 11 to electrode 17. It is evident that these two connections must cross, but the circuit requires that they shall not be connected together.

The problem is solved by providing a conductive region 24 within the body of semiconductor, adjacent to the insulation-covered surface and bounded by a pan-shaped p-n junction. In the example illustrated, the surrounding semiconductor is n-type, and therefore region 24 is made p+ -type, preferably heavily doped for high conductivity. Two metallic film electrodes 25 and 26 are deposited on the top surface of the body of semiconductor, over and in contact with different portions of region 24, so that the high conductivity region 24 provides an electrical connection between electrodes 25 and 26.

A metallic strip 27 extends over the layer 18 of insulation between electrodes 5 and 25, and a metallic strip 28 extends over the layer of insulation 18 between electrode 16 and electrode 26. Thus, there are formed two conductive strips that extend through the layer of insulation into contact with different portions of the conductive region 24; and these two strips and this conductive region in series form the desired electrical connection or circuit path between electrodes 5 and 16.

The layer of insulation 18 extends across the conductive region 24 between the two conductive strips that connect to it, as is most clearly shown in FIG 2 at 18′. A conductive strip 29, preferably a metallic film or coating, extends over the layer of insulation across the conductive region 24. One end of strip 29 extends to and connects with electrode 11 and the other end extends to and connects with electrode 17, thereby providing the desired connection and circuit path between electrodes 11 and 17 and completing the required four-terminal network.

Figure 3:
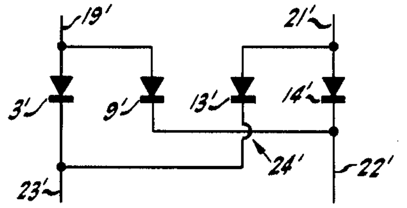
FIG. 3 is a circuit diagram of the same circuit.

FIG. 3 is a circuit diagram of the network. The four crystal diodes are shown symbolically at 3′, 9′, 13′, and 14′. The four terminals of the network are shown at 19′, 21′, 22′, and 23′. The necessary crossing of two leads is seen at 24′.

In the preferred method of making the structure illustrated in FIGS. 1 and 2, a monocrystalline body 1 of n-type silicon is heated in an oxidizing atmosphere to form an oxide layer 18 on its surface. Holes through this oxide layer are photoengraved over the areas to be occupied by the p+ -type regions, and regions 2, 8, 12, and 24 are formed by diffusing an acceptor impurity, e.g., phosphorus, through these holes into the semiconductor. Preferably, these regions are heavily doped for good conductivity, and are made deep enough to insure that the minimum thickness of these regions in the finished structure will be substantially greater than an electron diffusion length. An oxidizing atmosphere is admitted during diffusion at elevated temperature, and a new, somewhat thinner, layer of oxide forms on the exposed semiconductor surface within the holes.

Next, holes are photoengraved through the oxide over the areas to be occupied by the n+-type regions, and the regions 3, 9, 13, and 14 are formed by diffusing a donor impurity through these holes. This may be done in a substantially inert atmosphere, so that any new oxide layers formed in the holes are thin enough to be removed easily by a light chemical etching. Additional holes through the oxide are photoengraved over the areas to be occupied by electrodes connecting to the p+-type regions, so that a clean silicon surface is exposed in all of the areas to be occupied by electrodes 4, 5, 10, 11, 15, 16, 17, 25, and 26, while the remainder of the top surface of body 1 is covered by oxide layer 18.

Finally, the electrodes and connecting strips are applied, for example, by depositing a metallic (e.g., aluminum) film over oxide layer 18, including the areas of silicon exposed by holes in the oxide, and then removing the unwanted metal by photoengraving, leaving the electrodes and conductive strips illustrated in FIG. 1. Also, principles are equilly applicable to and useful in an end- the oxide is cleaned off the bottom surface of body 1, and a coating of metal is applied thereto to form the electrode 6.

It should be understood that the inventive principles herein disclosed are not limited to the specific circuit illustrated and described as an example, and that the same less variety of circuit combinations.

What is claimed is:

1. A solid-state electrical circuit structure comprising a body of semiconductor that contains p-type and n-type regions defining a plurality of functional circuit elements, said body having a surface, a layer of insulation on said surface, and a plurality of conductive strips that extend over said layer of insulation and electrically interconnect said functional circuit elements, said body of semiconductor also containing a conductive region of conductive semiconductor material that is adjacent to said surface and is bounded by a pan-shaped junction, two separate ones of said conductive strips extending through said layer of insulation into contact with different portions of said conductive region, said conductive region forming the only direct electrical connection between said two strips, said layer of insulation extending across said conductive region between said two strips, and a third separate one of said conductive strips extending over said layer of insulation across the conductive region between said two strips, said layer separating and insulating said third strip from said conductive region and said two strips, whereby the electrical connection defined by said third strip crosses without connecting to the electrical connection defined by said two strips and conductive region in series.

2. A structure as in claim 1, said layer of insulation being an oxidized layer of said semiconductor.

3. A structure as in claim 2, said conductive strips being metallic film adhering to said oxidized layer of semiconductor.

4. The method for making a solid-state circuit structure with crossing leads, which comprises oxidizing a surface of a monocrystalline body of semiconductor of one conductivity type, thereby forming an oxide layer thereon, photoengraving a hole through said oxide layer, diffusing an impurity of the opposite conductivity type through said hole into the semiconductor until said impurity is sufficiently concentrated to thereby form within the semiconductor a conductive region bounded by a pan-shaped p-n junction, reoxidizing the surface of the semiconductor thereby forming a new, thinner oxide layer over the surface within said hole, photoengraving two holes through said new oxide layer over different portions of said conductive region, forming a first metallic strip extending over the oxide and through one of said two holes into contact with one portion of said conductive region, forming a second metallic strip free from contact with said first metallic strip, extending over the oxide and through the other of said two holes into contact with another portion of said conductive region, so that said first strip and conductive region and second strip in series constitute one current path, and forming a third metallic strip extending across said conductive region over the oxide layer between said two holes, said third strip constituting another current path that crosses the first-mentioned path without connection to it.

References Cited by the Examiner

UNITED STATES PATENTS 2,981,877 4/61 Noyce ........ 217—235

FOREIGN PATENTS 753,632 7/56 Great Britain.

JOHN W. HUCKERT, *Primary Examiner.*